United States Patent [19]

Pigott

[11] Patent Number: 4,712,026
[45] Date of Patent: Dec. 8, 1987

[54] DELAY CIRCUIT

[75] Inventor: John M. Pigott, Tempe, Ariz.

[73] Assignee: Motorola, Inc., Schaumburg, Ill.

[21] Appl. No.: 926,498

[22] Filed: Nov. 4, 1986

[51] Int. Cl.$^4$ .......................................... H03K 5/13
[52] U.S. Cl. ..................... 307/600; 307/603; 307/605; 307/607; 307/590; 307/594; 307/597
[58] Field of Search ............... 307/600, 603, 605, 607, 307/590, 594, 597, 246, 601, 602, 604; 328/55, 129.1

[56] References Cited

U.S. PATENT DOCUMENTS

| 2,924,724 | 2/1960 | Booker, Jr. | 307/600 |
| 3,254,242 | 5/1966 | Sillers, Jr. | 307/600 |
| 3,693,030 | 9/1972 | Walters | 307/600 |

Primary Examiner—Stanley D. Miller
Assistant Examiner—Trong Quang Phan
Attorney, Agent, or Firm—Michael D. Bingham

[57] ABSTRACT

A power reset delay circuit is described which when energized provides a delayed output signal a predetermined time interval thereafter and which draws substantially zero current when turned off. The delay circuit comprises a first transistor which when turned on disables the discharge path to a capacitor while enabling the charging of the same through the base-emitter path of a second transistor the emitter of which is connected to the base of a third transistor. A P-type semiconductor ring is formed about the collector of the third transistor and in combination therewith functions as a comparator to provide the output signal when the third transistor saturates due to the charging of the capacitor reducing the voltage level at the base thereof.

5 Claims, 1 Drawing Figure

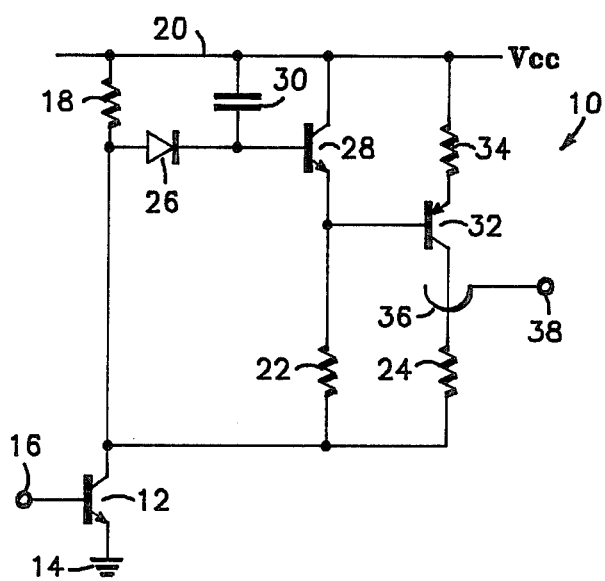

DELAY CIRCUIT

BACKGROUND OF THE INVENTION

The present invention relates to time delay circuits and, more particularly, to a delay circuit which when energized provides an output signal a predetermined time interval after an input signal is applied thereto.

The prior art is replete with different types of delay circuits that are utilized in a myriad of applications. For example, one such application in which a delay circuit may be used is in the oil level sensor system of automobiles. In the oil level sensor system it may be desired to delay system operation a predetermined time interval after power is applied thereto to allow all circuitry to stabilize into a quiescent condition. Hence, in response to the system being energized the delay circuit will delay initiation of the system operation for a time period. It is desirable that the delay circuit have substantially zero drain current when it is non-operative so that power consumption in the oil level sensor system, among other considerations, is reduced. Further, it is desirable that such a delay circuit provide time delay interval that is independent of the operating potential of the system.

SUMMARY OF THE INVENTION

Accordingly, it is an object of the present invention to provide an improved delay circuit.

It is another object of the invention to provide an improved delay circuit that provides an output signal a predetermined time interval after being energized.

Still another object of the invention is to provide an improved monolithic integrated delay circuit.

Yet another object of the invention is to provide an integrated delay circuit for providing a delayed output signal after being energized and in which the time delay is independent of the operating potential supplied thereto.

Still yet another object of the invention is to provide an integrated delay circuit having substantially zero drain current whenever the circuit is in a non-operative condition.

In accordance with the above and other objects there is provided a delay circuit comprising a capacitor, a discharge circuit for providing a discharge path for the capacitor whenever power is removed from the circuit, a circuit for providing a charge path for the capacitor when energized, a circuit responsive to an input signal applied to the delay circuit for inhibiting the discharge circuit while energizing the charge circuit whereby the capacitor is charged and a comparator for providing an output signal when the capacitor is charged to a predetermined level.

BRIEF DESCRIPTION OF THE DRAWING

The sole FIGURE is a schematic drawing illustrating the integrated delay circuit of the preferred embodiment.

DETAILED DESCRIPTION OF THE PREFERRED EMBODIMENT

Turning now to the single FIGURE there is shown delay circuit 10 of the present invention which is suitable to be fabricated in integrated circuit form. As will be described later delay circuit 10 when energized is responsive to an input signal supplied to the base of NPN transistor 12, the emitter of which is coupled to power supply conductor 14, at input 16 to provide an output signal at output 38 a predetermined time interval thereafter. Delay circuit 10 includes a discharge circuit comprising resistor 18 and diode 26. Resistor 18 is coupled between power supply conductor 20 to which is supplied operating potential Vcc and the collector of transistor 12. Ground reference potential is supplied to power supply conductor 14. The collector of transistor 12 is also coupled through resistors 22 and 24 respectively to the emitter of NPN transistor 28 and the collector of PNP transistor 32. The base of transistor 28 is coupled at a first circuit node to the cathode of diode 26 and to one side of capacitor 30, the anode of diode 26 is coupled to the interconnection of resistor 18 and transistor 12. The other side of capacitor 30 is coupled to power supply conductor 20. The collector of transistor 28 is returned to power supply conductor 20. The emittercollector path of transistor 32 is coupled via resistors 34 and 24 between power supply conductor 20 and the collector of transistor 12 while its base is coupled to the emitter of transistor 28. A secondary P-type semiconductor ring 36 is formed about the collector of transistor 32 as is understood and is coupled to output 38 of delay circuit 10. Transistor 28 and resistor 22 provide a path for charging capacitor 30 when transistor 28 is turned on. Transistor 32 and associated P-type ring 36 function as a comparator as will be described.

In operation, whenever transistor 12 is turned off capacitor 30 is discharged through diode 26 and resistor 18. Whenever transistor 12 is turned on by a positive input signal supplied at input 16 it will saturate to substantially drive the interconnection between resistor 18 and diode 26 to ground which inhibits the discharge path for capacitor 30. Simultaneously, the conduction of transistor 12 turns on transistor 28 to provide a charge path for capacitor 30. Capacitor 30 is charged through the base-emitter conduction path of transistor 28 at a rate proportional to the ratio of the current flowing through resistor 22 divided by the forward current gain, beta, of transistor 28. With transistor 28 configured as an emitter follower the voltage developed at the emitter thereof is a function of the voltage level applied at the base. Hence, as the base voltage of transistor 28 falls due to capacitor 30 charging, the voltage level at the base of transistor 32 falls which renders the transistor more and more conductive. Eventually the voltage level at the base of transistor 32 will reach a value that causes the transistor to become saturated. As transistor 32 saturates the minority carriers that are re-injected into the base-collector thereof are collected by P-type ring 36 to produce an output current signal at output 38 a predetermined time interval after the input signal is applied to the circuit. This time interval is substantially independent of the value of Vcc. In addition, whenever delay circuit 10 is energized and transistor 12 is non-conducting, there is essentially no drain current through the circuit.

Hence, what has been described above is a novel delay circuit for providing an output signal a predetermined time interval after an input signal is supplied to the input thereof.

I claim:

1. An integrated circuit responsive to an input signal for providing an output signal a predetermined time interval thereafter, comprising:

first and second power supply conductors to which an operating potential and a ground reference potential are respectively supplied;

a charge storage device coupled between said first power supply conductor and a first circuit node;

discharge circuit means connected between said first circuit node and said first power supply conductor for providing a discharge current path for said charge storage device when enabled;

charge circuit means coupled between said first power supply conductor and a second circuit node and having an input coupled to said first circuit node for providing a current path for charging said charge storage device when enabled;

a first transistor having a base coupled to an input of the circuit, an emitter coupled to said second power supply conductor and a collector coupled both to said discharge circuit means and said second circuit node, said first transistor being responsive to the input signal for disabling said discharge circuit means while enabling said charge circuit means, said discharge circuit means being enabled when said first transistor is rendered nonconductive; and comparator means having an input coupled to said charge circuit means and being responsive to said charge storage device being charged to a predetermined level for providing the output signal at an output a predetermined time interval after the input signal is applied to the delay circuit.

2. The circuit of claim 1 wherein said discharge circuit means includes:

a diode coupled between said first circuit node and a third circuit node;

first resistive means coupled between said first power supply conductor and said third circuit node; and means for connecting said third circuit node to said collector of said first transistor.

3. The circuit of claim 2 wherein said charge circuit means includes:

a second transistor having a base coupled to said first circuit node, an emitter, and a collector coupled to said first power supply conductor; and second resistive means coupled between said emitter of said second transistor and said second circuit node.

4. The circuit of claim 3 wherein said comparator means includes:

a third transistor having a base coupled to said emitter of said second transistor, an emitter coupled to said first power supply conductor and a collector coupled to said collector of said first transistor, said third transistor becoming saturated as said charge storage device is charged to said predetermined level; and a P-type semiconductor material ring formed about said collector of said third transistor and being coupled to the output of the circuit.

5. The circuit of claim 4 including:

third resistive means coupled between said first power supply conductor and said emitter of said third transistor; and fourth resistive means coupled between said collectors of said first and said third transistors.

* * * * *